US006576395B1

(12) United States Patent
Van Damme et al.

(10) Patent No.: US 6,576,395 B1
(45) **Date of Patent: *Jun. 10, 2003**

(54) PROCESSLESS PRINTING PLATE WITH HIGH RATIO OF INORGANIC PIGMENT OVER HARDENER IN A HYDROPHILIC LAYER

(75) Inventors: Marc Van Damme, Mechelen (BE); Joan Vermeersch, Deinze (BE)

(73) Assignee: Agfa-Gevaert, Mortsel (BE)

( * ) Notice: Subject to any disclaimer, the term of this patent is extended or adjusted under 35 U.S.C. 154(b) by 0 days.

This patent is subject to a terminal disclaimer.

(21) Appl. No.: 09/599,964

(22) Filed: Jun. 23, 2000

Related U.S. Application Data

(60) Provisional application No. 60/144,225, filed on Jul. 19, 1999.

(30) Foreign Application Priority Data

Jun. 29, 1999 (EP) ........................................... 99202111

(51) Int. Cl.$^{7}$ ............................................... G03F 7/039

(52) U.S. Cl. ............................... 430/270.1; 430/272.1; 430/273.1; 430/278.1; 430/302; 430/348; 430/944; 430/945; 101/453; 101/454; 101/455; 101/463.1; 101/466; 101/467

(58) Field of Search .......................... 430/270.1, 271.1, 430/272.1, 273.1, 278.1, 302, 303, 348, 944, 945; 101/453, 454, 463.1, 465, 466, 467

(56) References Cited

U.S. PATENT DOCUMENTS

| | | | | | |
|---|---|---|---|---|---|
| 5,379,698 | A | * | 1/1995 | Nowak et al. | 101/454 |
| 5,985,515 | A | * | 11/1999 | Van Rompuy et al. | 430/272.1 |
| 6,014,930 | A | * | 1/2000 | Burberry et al. | 101/456 |
| 6,090,524 | A | * | 7/2000 | Deboer et al. | 430/272.1 |
| 6,093,519 | A | * | 7/2000 | Rompuy et al. | 430/303 |
| 6,110,645 | A | * | 8/2000 | DeBoer et al. | 430/302 |
| 6,136,508 | A | * | 10/2000 | DeBoer et al. | 430/302 |
| 6,153,353 | A | * | 11/2000 | Van Damme et al. | 430/270.1 |
| 6,207,348 | B1 | * | 3/2001 | Deboer et al. | 430/302 |
| 6,210,857 | B1 | * | 4/2001 | Vermeersch et al. | 430/270.1 |
| 6,340,815 | B1 | * | 1/2002 | Verschueren et al. | 250/318 |
| 2001/0024766 | A1 | * | 9/2001 | Kita et al. | 430/272.1 |
| 2001/0033992 | A1 | * | 10/2001 | Kita | 430/273.1 |

FOREIGN PATENT DOCUMENTS

| | | |
|---|---|---|
| EP | 0 763 424 A2 | 3/1997 |
| EP | 0 763 424 A3 | 4/1998 |
| WO | WO 98/34796 | 8/1998 |
| WO | WO 99/19143 | 4/1999 |

OTHER PUBLICATIONS

Derwent Publications Ltd., London, GB, AN 1980–68629C, XP002119255 & JP 55 105560 A (Tomoegawa Paper Mfg. Co. Ltd.), Aug. 13, 1980.

* cited by examiner

*Primary Examiner*—Rosemary Ashton
*Assistant Examiner*—Barbara Gilliam
(74) *Attorney, Agent, or Firm*—Breiner & Breiner, L.L.C.

(57) ABSTRACT

According to the present invention there is provided a heat-sensitive material for making lithographic plates comprising in the order given on a support an IR-sensitive oleophilic layer and an ablatable cross-linked hydrophilic layer comprising an inorganic pigment and a hardener, characterized in that the ratio of said inorganic pigment over the hardener is comprised between 95/5 and 75/25 by weight.

10 Claims, No Drawings

PROCESSLESS PRINTING PLATE WITH HIGH RATIO OF INORGANIC PIGMENT OVER HARDENER IN A HYDROPHILIC LAYER

This application claims benefit of U.S. Provisional Application No. 60/144,225 filed Jul. 19, 1999.

FIELD OF THE INVENTION

The present invention relates to a heat mode recording material for making a lithographic plate for use in lithographic printing. The present invention further relates to a method for imaging said heat mode recording material e.g. by means of a laser.

BACKGROUND OF THE INVENTION

Lithographic printing is the process of printing from specially prepared surfaces, some areas of which are capable of accepting ink (oleophilic areas) whereas other areas will not accept ink (hydrophilic areas). According to the so called conventional or wet printing plates, both water or an aqueous dampening liquid and ink are applied to the plate surface that contains hydrophilic and oleophilic areas. The hydrophilic areas will be soaked with water or the dampening liquid and are thereby rendered oleophobic while the oleophilic areas will accept the ink.

When a laser heat mode recording material is to be used as a direct offset master for printing with greasy inks, it is necessary to have oleophilic-hydrophilic mapping of the image and non-image areas. In the case of heat mode laser ablation it is also necessary to completely image wise remove a hydrophilic or oleophilic topcoat to expose the underlying oleophilic respectively hydrophilic surface of the laser sensitive recording material in order to obtain the necessary difference in ink-acceptance between the image and non-image areas.

For example DE-A-2 448 325 discloses a laser heat mode "direct negative" printing plate comprising e.g. a polyester film support provided with a hydrophilic surface layer. The disclosed heat mode recording material is imaged using an Argon laser thereby rendering the exposed areas oleophilic. An offset printing plate is thus obtained which can be used on a printing press without further processing. The plate is called a "direct negative" plate because the areas of the recording material that have been exposed are rendered ink accepting.

Other disclosures in DE-A-2 448 325 concern "direct negative" printing plates comprising e.g. hydrophilic aluminum support coated with a water soluble laser light (Argon-488 nm) absorbing dye or with a coating based on a mixture of hydrophilic polymer and laser light absorbing dye (Argon-488 nm). Further examples about heat mode recording materials for preparing "direct negative" printing plates include e.g. U.S. Pat. No. 4,341,183, DE-A-2 607 207, DD-A-213 530, DD-A-217 645 and DD-A-217 914. These documents disclose heat mode recording materials that have on an anodized aluminum support a hydrophilic layer. The disclosed heat mode recording materials are image-wise exposed using a laser. Laser exposure renders the exposed areas insoluble and ink receptive, whereas the non exposed image portions remain hydrophilic and water soluble allowing to be removed by the dampening liquid during printing exposing the hydrophilic support. Such plates can be used directly on the press without processing.

DD-A-155 407 discloses a laser heat mode "direct negative" printing plate where a hydrophilic aluminum oxide layer is rendered oleophilic by direct laser heat mode imaging. These printing plates may also be used on the press without further processing.

From the above it can be seen that a number of proposals have been made for making a 'direct negative' offset printing plate by laser heat mode recording. They have such disadvantages as low recording speed and/or the obtained plates are of poor quality.

Another way of making direct lithographic plates is by laser ablation.

EP-A-580 393 discloses a lithographic printing plate directly imageable by laser discharge, the plate comprising a topmost first layer and a second layer underlying the first layer wherein the first layer is characterized by efficient absorption of infrared radiation and the first and second layer exhibit different affinities for at least one printing liquid.

EP-A-683 728 discloses a heat mode recording material comprising on a support having an ink receptive surface or being coated with an ink receptive layer a substance capable of converting light into heat and a hardened hydrophilic surface layer having a thickness not more than 3 $\mu$m. The lithographic properties of said material are not very good.

OBJECTS OF THE INVENTION

It is an object of the present invention to provide a material for a heat mode recording material of high sensitivity and high lithographic quality, especially in regard to little toning at start-up.

SUMMARY OF THE INVENTION

According to the present invention there is provided a heat-sensitive material for making lithographic plates comprising in the order given on a support an IR-sensitive oleophilic layer and an ablatable cross-linked hydrophilic layer comprising an inorganic pigment and a hardener, characterized in that the ratio of said inorganic pigment over the hardener is comprised between 95/5 and 75/25 by weight.

DETAILED DESCRIPTION OF THE INVENTION

In this invention it has been found that by using a lithographic base in combination with a high ratio of inorganic pigment over hardener in the hydrophilic layer, little toning at start-up is obtained.

The IR-sensitive oleophilic layer amounts preferably to a dry weight between 0.1 and 0.75 g/m$^2$, more preferably between 0.15 and 0.5 g/m$^2$.

The IR-sensitive oleophilic layer comprises a binder and a compound capable of converting light into heat.

Suitable compounds capable of converting light into heat are preferably infrared absorbing components having an absorption in the wavelength range of the light source used for image-wise exposure. Particularly useful compounds are for example dyes and in particular infrared dyes as disclosed in EP-A-908 307 and pigments and in particular infrared pigments such as carbon black, metal carbides, borides, nitrides, carbonitrides, bronze-structured oxides and oxides structurally related to the bronze family but lacking the A component e.g. $WO_{2.9}$. It is also possible to use conductive polymer dispersion such as polypyrrole or polyaniline-based conductive polymer dispersions. The lithographic performance and in particular the print endurance obtained depends i.a. on the heat-sensitivity of the imaging element.

In this respect it has been found that carbon black or graphite yields very good and favorable results.

Preferably the binder is selected from the group consisting of polyvinyl chloride, polyesters, polyurethanes, novolac, polyvinyl carbazole etc., copolymers or mixtures thereof.

Most preferably the polymeric binder in the recording layer is heat sensitive: e.g. a polymer containing nitrate ester groups (e.g. self oxidizing binder cellulose nitrate as disclosed in GB-P-1 316 398 and DE-A-2 512 038); e.g. a polymer containing carbonate groups (e.g. polyalkylene carbonate); e.g. a polymer containing covalently bound chlorine (e.g. polyvinylidene chloride). Also substances containing azo or azide groups, capable of liberating $N_2$ upon heating are favorably used.

Different kinds of hardened hydrophilic surface layers are suitable in connection with the present invention. The hydrophilic coatings are preferably cast from aqueous compositions containing hydrophilic binders having free reactive groups including e.g. hydroxyl, carboxyl, hydroxyethyl, hydroxypropyl, amino, aminoethyl, aminopropyl, carboxymethyl, etc. along with suitable cross-linking or modifying agents including e.g. hydrophilic organotitanium reagents, aluminoformyl acetate, dimethylol urea, melamines, aldehydes, hydrolyzed tetraalkyl orthosilicate, etc.

Suitable polymers for hydrophilic layers may be selected from the group consisting of gum arabic, casein, gelatin, starch derivatives, carboxymethyl cellulose and Na salt thereof, cellulose acetate, sodium alginate, vinyl acetate-maleic acid copolymers, styrene-maleic acid copolymers, polyacrylic acids and salts thereof, polymethacrylic acids and salts thereof, hydroxyethylene polymers, polyethylene glycols, hydroxypropylene polymers, polyvinyl alcohols, and hydrolyzed polyvinylacetate having a hydrolyzation degree of at least 60% by weight and more preferably at least 80% by weight.

Hydrophilic layers containing polyvinylalcohol or polyvinylacetate hydrolyzed to an extent of at least 60% by weight hardened with a tetraalkyl orthosilicate, e.g. tetraethyl orthosilicate or tetramethyl orthosilicate, as disclosed in e.g. U.S. Pat. No. 3,476,937 are particularly preferred because their use in the present heat mode recording material results in excellent lithographic printing properties.

A cross-linked hydrophilic binder in the heat-sensitive material used in accordance with the present embodiment also contains inorganic pigments that increase the mechanical strength and the porosity of the layer e.g. colloidal metal oxide particles that are particles of titanium dioxide or other metal oxides. Incorporation of these particles gives the surface of the cross-linked hydrophilic layer a uniform rough texture consisting of microscopic hills and valleys. Preferably these particles are oxides or hydroxides of beryllium, magnesium, aluminum, silicon, gadolinium, germanium, arsenic, indium, tin, antimony, tellurium, lead, bismuth or a transition metal. Particularly preferable colloidal particles are oxides or hydroxides of aluminum, silicon, zirconium and titanium, used in 20 to 95% by weight of the hydrophilic layer, more preferably in 30 to 90% by weight of the hydrophilic layer.

The cross-linked hydrophilic layer is preferably coated at a dry thickness of 0.3 to 5 $\mu$m, more preferably at a dry thickness of 0.5 to 3 $\mu$m.

According to the present invention the hardened hydrophilic layer may comprise additional substances such as e.g. plasticizers, pigments, dyes etc. The cross-linked hydrophilic layer can additionally contain an IR-absorbing compound in order to increase the IR-sensitivity. Particular examples of suitable cross-linked hydrophilic layers for use in accordance with the present invention are disclosed in EP-A-601 240, GB-P-1 419 512, FR-P-2 300 354, U.S. Pat. No. 3,971,660, U.S. Pat. No. 4,284,705 and EP-A-514 490.

The support according to the present invention can be a dimensionally stable support e.g. aluminum or another metal or alloy or it can be a flexible support e.g. polyethylene terephthalate. Preferably the support is a lithographic base with a hydrophilic surface.

According to the present invention, the lithographic base may be an anodized aluminum support. A particularly preferred lithographic base is an electrochemically grained and anodized aluminum support. The anodized aluminum support may be treated to improve the hydrophilic properties of its surface. For example, the aluminum support may be silicated by treating its surface with sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or may be carried out at a slightly elevated temperature of about 30 to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulphonic acid, polyvinylbenzenesulphonic acid, sulfuric acid esters of polyvinyl alcohol, and acetals of polyvinyl alcohols formed by reaction with a sulphonated aliphatic aldehyde It is further evident that one or more of these post treatments may be carried out alone or in combination. More detailed descriptions of these treatments are given in GB-A-1 084 070, DE-A-4 423 140, DE-A-4 417 907, EP-A-659 909, EP-A-537 633, DE-A-4 001 466, EP-A-292 801, EP-A-291 760 and U.S. Pat. No. 4,458,005.

According to another mode in connection with the present invention, the lithographic base with a hydrophilic surface comprises a flexible support, such as e.g. paper or plastic film, provided with a cross-linked hydrophilic layer. A particularly suitable cross-linked hydrophilic layer may be obtained from a hydrophilic binder cross-linked with a cross-linking agent such as formaldehyde, glyoxal, polyisocyanate or a hydrolyzed tetraalkylorthosilicate. The latter is particularly preferred.

As hydrophilic binder there may be used hydrophilic (co)polymers such as for example, homopolymers and copolymers of vinyl alcohol, acrylamide, methylol acrylamide, methylol methacrylamide, acrylate acid, methacrylate acid, hydroxyethyl acrylate, hydroxyethyl methacrylate or maleic anhydride/vinylmethylether copolymers. The hydrophilicity of the (co)polymer or (co)polymer mixture used is preferably the same as or higher than the hydrophilicity of polyvinyl acetate hydrolyzed to at least an extent of 60 percent by weight, preferably 80 percent by weight.

The amount of crosslinking agent, in particular of tetraalkyl orthosilicate, is preferably at least 0.2 parts by weight per part by weight of hydrophilic binder, more preferably between 0.5 and 5 parts by weight, most preferably between 1.0 parts by weight and 3 parts by weight.

A cross-linked hydrophilic layer in a lithographic base used in accordance with the present embodiment preferably also contains substances that increase the mechanical strength and the porosity of the layer. For this purpose colloidal silica may be used. The colloidal silica employed may be in the form of any commercially available water dispersion of colloidal silica for example having an average particle size up to 40 nm, e.g. 20 nm. In addition inert particles of larger size than the colloidal silica may be added e.g. silica prepared according to Stober as described in J. Colloid and Interface Sci., Vol. 26, 1968, pages 62 to 69 or alumina particles or particles having an average diameter of at least 100 nm which are particles of titanium dioxide or other heavy metal oxides. By incorporating these particles the surface of the cross-linked hydrophilic layer is given a uniform rough texture consisting of microscopic hills and valleys, which serve as storage places for water in background areas.

The thickness of a cross-linked hydrophilic layer in a lithographic base in accordance with this embodiment may vary in the range of 0.2 to 25 μm and is preferably 1 to 10 μm.

Particular examples of suitable cross-linked hydrophilic layers for use in accordance with the present invention are disclosed in EP-A-601 240, GB-P-1 419 512, FR-P-2 300 354, U.S. Pat. No. 3,971,660, U.S. Pat. No. 4,284,705 and EP-A-514 490.

As flexible support of a lithographic base in connection with the present embodiment it is particularly preferred to use a plastic film e.g. substrated polyethylene terephthalate film, substrated polyethylene naphthalate film, cellulose acetate film, polystyrene film, polycarbonate film etc. The plastic film support may be opaque or transparent. Also suitable as flexible support is glass with a thickness less than 1.2 mm and a failure stress (under tensile stress) equal or higher than $5\times10^7$.

It is particularly preferred to use a polyester film support to which an adhesion-improving layer has been provided. Particularly suitable adhesion improving layers for use in accordance with the present invention comprise a hydrophilic binder and colloidal silica as disclosed in EP-A-619 524, EP-A-620 502 and EP-A-619 525. Preferably, the amount of silica in the adhesion-improving layer is between 200 mg per m2 and 750 mg per m2. Further, the ratio of silica to hydrophilic binder is preferably more than 1 and the surface area of the colloidal silica is preferably at least 300 m2 per gram, more preferably at least 500 m2 per gram.

Optionally the heat sensitive imaging element can be covered with a layer comprising at least an organic compound containing cationic groups as described in the application filed on the same day.

In accordance with the present invention the imaging element is image-wise exposed. During said exposure, in the exposed areas the cross-linked hydrophilic layer can be removed and said areas are converted to oleophilic areas while the unexposed areas remain hydrophilic. This is mostly the case when using short pixel dwell times (for example 1 to 100 ns). However when using longer pixel dwell times (for example 1 to 20 μs) the hydrophilic layer is not or only partially removed upon exposure. The remaining parts of the hydrophilic layer can be removed on the press by contact with fountain solution and ink or by an additional wet or dry processing step between the IR-laser exposure and the start-up of the printing process.

Image-wise exposure in connection with the present invention is preferably an image-wise scanning exposure involving the use of a laser or L.E.D. Preferably used are lasers that operate in the infrared or near-infrared, i.e. wavelength range of 700–1500 nm. Most preferred are laser diodes emitting in the near infrared with an intensity greater than 0.1 mW/$\mu m^2$.

According to the present invention the plate is then ready for printing without an additional development and can be mounted on the printing press.

According to a further method, the imaging element is first mounted on the printing cylinder of the printing press and then, image-wise exposed directly on the press. Subsequent to exposure, the imaging element is ready for printing.

The printing plate of the present invention can also be used in the printing process as a seamless sleeve printing plate. In this option the printing plate is soldered in a cylindrical form by means of a laser. This cylindrical printing plate which has as diameter the diameter of the print cylinder is slid on the print cylinder instead of mounting a conventional printing plate. More details on sleeves are given in "Grafisch Nieuws", 15, 1995, page 4 to 6.

The following example illustrates the present invention without limiting it thereto. All parts and percentages are by weight unless otherwise specified.

EXAMPLE

Preparation of the Lithographic Base

A 0.30 mm thick aluminum foil was degreased by immersing the foil in an aqueous solution containing 5 g/l of sodium hydroxide at 50° C. and rinsed with demineralized water. The foil was then electrochemically grained using an alternating current in an aqueous solution containing 4 g/l of hydrochloric acid, 4 g/l of hydroboric acid and 5 g/l of aluminum ions at a temperature of 35° C. and a current density of 1200 A/$m^2$ to form a surface topography with an average center-line roughness Ra of 0.5 mm.

After rinsing with demineralized water the aluminum foil was then etched with an aqueous solution containing 300 g/l of sulfuric acid at 60° C. for 180 seconds and rinsed with demineralized water at 25° C. for 30 seconds.

The foil was subsequently subjected to anodic oxidation in an aqueous solution containing 200 g/l of sulfuric acid at a temperature of 45° C., a voltage of about 10 V and a current density of 150 A/$m^2$ for about 300 seconds to form an anodic oxidation film of 3.00 g/$m^2$ of $Al_2O_3$ then washed with demineralized water, post treated with a solution containing polyvinylphosphonic acid and subsequently with a solution containing aluminum trichloride, rinsed with demineralized water at 20° C. during 120 seconds and dried.

On top of said lithographic base was coated the IR-sensitive layer to a wet coating thickness of 20 μm from a solution having the following composition:

52 g Carbon black dispersion of the following composition
- 6.5 g Special Schwarz™ (Degussa)
- 0.65 g Nitrocellulose E950™ (Wolf Walsrode)
- 0.78 g Dispersing agent
- 44.07 g Methyl ethyl ketone 15.7 g Nitrocellulose solution of the following composition
- 1.57 g Nitrocellulose E950™
- 14.13 g Ethylacetate 2.12 g Cymel solution of the following composition
- 0.42 g Cymel 301™
- 1.70 g Ethylacetate 0.76 g p-toluene sulphonic acid solution of the following composition
- 0.08 g p-toluene sulphonic acid
- 0.69 g Ethylacetate After drying the IR-sensitive layer, this resulted in a dry layer of 0.3 g/m2. Then, the hydrophilic layer was coated to a wet coating thickness of 20 $\mu$m from a solution having the following compositions Element 1

100.0 g TiO2—dispersion in water, stabilized with Polyviol WX 48™ (polyvinyl alcohol from Wacker) (10% w/w polyvinyl alcohol versus $TiO_2$) (average particle size 0.3 to 0.5 $\mu$m)-6.25% w/w 0.0 g hydrolyzed tetramethyl orthosilicate in water/ethanol-6.25% w/w 1.2 g wetting agent in water-5% w/w.

Element 2

90.9 g TiO2—dispersion in water, stabilized with Polyviol WX 48™ (polyvinyl alcohol from Wacker) (10% w/w polyvinyl alcohol versus $TiO_2$) (average particle size 0.3 to 0.5 $\mu$m)-6.25% w/w 9.1 g hydrolyzed tetramethyl orthosilicate in water/ethanol-6.25% w/w 1.2 g wetting agent in water-5% w/w.

Element 3

81.6 g TiO2—dispersion in water, stabilized with Polyviol WX 48™ (polyvinyl alcohol from Wacker) (10% w/w polyvinyl alcohol versus $TiO_2$) (average particle size 0.3 to 0.5 $\mu$m)-6.25% w/w 18.4 g hydrolyzed tetramethyl orthosilicate in water/ethanol-6.25% w/w 1.2 g wetting agent in water-5% w/w.

Element 4

72.2 g TiO2—dispersion in water, stabilized with Polyviol WX 48™ (polyvinyl alcohol from Wacker) (10% w/w polyvinyl alcohol versus $TiO_2$)(average particle size 0.3 to 0.5 $\mu$m)-6.25% w/w 27.8 g hydrolyzed tetramethyl orthosilicate in water/ethanol-6.25% w/w 1.2 g wetting agent in water-5% w/w.

Element 5

62.5 g TiO2—dispersion in water, stabilized with Polyviol WX 48™ (polyvinyl alcohol from Wacker) (10% w/w polyvinyl alcohol versus $TiO_2$) (average particle size 0.3 to 0.5 $\mu$m)-6.25% w/w 37.5 g hydrolyzed tetramethyl orthosilicate in water/ethanol-6.25% w/w 1.2 g wetting agent in water-5% w/w.

The pH of these solutions was adjusted to 4 prior to coating. These layers were hardened for 12 hours at 67° C. 50% R.H. In this way the different elements were obtained.

The resulting imaging elements were imaged on a Gerber C42 T™ at 2400 dpi operating at a scanning speed of 150 rps and a laser output of 7.5 Watt After imaging the plate was mounted on a Heidelberg GTO52 press using K+E 800 Skinnex as ink and rotamatic as fountain solution.

Subsequently the press was started by allowing the print cylinder with the imaging element mounted thereon to rotate. The dampener rollers of the press were first dropped on the imaging element so as to supply dampening liquid to the imaging element and after 5 revolutions of the print cylinder, the ink rollers were dropped to supply ink. After 5 further revolutions paper was feeded. The start-up behavior was determined based on the number of sheets that were printed before toning-free prints were obtained. The results are summarized in table 1.

TABLE 1

| Element | Inorganic pigment/hardener | Start-up behavior |
|---|---|---|
| 1 | 100/0 | hydrophilic layer not resistant |
| 2 | 90/10 | 1 |
| 3 | 80/20 | 1 |
| 4 | 70/30 | 15 |
| 5 | 60/40 | >50 |

What is claimed is:

1. A heat-sensitive material for making lithographic plates comprising in the order given on a support an IR-sensitive oleophilic layer and a cross-linked hydrophilic layer comprising a hydrophilic organic polymer, an inorganic pigment and a hardener, said cross-linked hydrophilic layer being free of photothermal conversion material, wherein the ratio of said inorganic pigment over the hardener is comprised between 95/5 and 75/25 by weight.

2. A heat-sensitive material according to claim 1 wherein said support is a lithographic base with a hydrophilic surface.

3. A heat-sensitive material according to claim 2 wherein said lithographic base is a grained and anodized aluminum support.

4. A heat-sensitive material according to claim 2 wherein said lithographic base is a cross-linked hydrophilic layer on a flexible support.

5. A heat-sensitive material according to claim 1 wherein said IR-sensitive oleophilic layer amounts to a dry weight between 0.1 and 0.75 g/m$^2$.

6. A heat-sensitive material according to claim 1 wherein said oleophilic layer comprises a binder and a compound capable of converting light into heat.

7. A heat-sensitive material according to claim 6 wherein said binder is heat sensitive.

8. A heat-sensitive material according to claim 6 wherein said compound capable of converting light into is carbon black.

9. A heat-sensitive material according to claim 1 wherein the hydrophilic layer has a dry thickness between 0.3 and 5 $\mu$m.

10. A method for making lithographic printing plates comprising the steps of (i) image-wise exposing to a laser beam having an intensity greater than 0.1 mW/$\mu$m$^2$ a heat sensitive material according to claim 1; (ii) before or after step (i) mounting the plate on a printing press; (iii) contacting the plate with fountain solution and ink.

* * * * *

UNITED STATES PATENT AND TRADEMARK OFFICE

CERTIFICATE OF CORRECTION

PATENT NO. : 6,576,395 B1
DATED : June 10, 2003
INVENTOR(S) : Marc Van Damme et al.

It is certified that error appears in the above-identified patent and that said Letters Patent is hereby corrected as shown below:

Column 8,
Line 46, after “light into” insert -- heat --.

Signed and Sealed this

Seventh Day of October, 2003

JAMES E. ROGAN
*Director of the United States Patent and Trademark Office*